(12) United States Patent
Du et al.

(10) Patent No.: US 8,384,438 B1
(45) Date of Patent: Feb. 26, 2013

(54) SINGLE-TO-DIFFERENTIAL CONVERSION CIRCUIT AND METHOD

(75) Inventors: Zhenchang Du, Hangzhou (CN);
Haiming Tang, Cupertino, CA (US);
Wei Wang, San Jose, CA (US)

(73) Assignee: Initio Corporation, San Jose, CA (US)

( * ) Notice: Subject to any disclaimer, the term of this patent is extended or adjusted under 35 U.S.C. 154(b) by 77 days.

(21) Appl. No.: 13/207,771

(22) Filed: Aug. 11, 2011

(51) Int. Cl.
*H03K 19/096* (2006.01)

(52) U.S. Cl. ............ 326/97; 326/83; 327/109; 327/144; 327/295

(58) Field of Classification Search ............... 326/82–83, 326/86, 95–97; 327/108–109, 141, 144, 327/172, 178, 291, 295
See application file for complete search history.

(56) References Cited

U.S. PATENT DOCUMENTS

| | | | | | |
|---|---|---|---|---|---|
| 4,782,253 | A | * | 11/1988 | Shoji | 326/17 |
| 5,495,189 | A | * | 2/1996 | Choi | 326/97 |
| 5,751,176 | A | * | 5/1998 | Sohn et al. | 327/295 |
| 5,867,043 | A | * | 2/1999 | Kim | 327/257 |
| 5,874,845 | A | * | 2/1999 | Hynes | 327/259 |
| 6,172,542 | B1 | * | 1/2001 | Williams et al. | 327/239 |
| 6,208,186 | B1 | * | 3/2001 | Nair | 327/199 |
| 6,420,920 | B1 | * | 7/2002 | Huber et al. | 327/257 |
| 6,680,637 | B2 | * | 1/2004 | Seo | 327/175 |
| 7,030,673 | B2 | * | 4/2006 | Song | 327/258 |
| 7,034,595 | B2 | * | 4/2006 | Lee | 327/233 |
| 7,119,602 | B2 | * | 10/2006 | Davis | 327/415 |
| 7,368,950 | B2 | * | 5/2008 | Wu et al. | 326/83 |
| 7,667,522 | B1 | * | 2/2010 | Maung | 327/333 |
| 2007/0252631 | A1 | * | 11/2007 | Kaviani et al. | 327/295 |
| 2008/0265964 | A1 | * | 10/2008 | Park | 327/257 |
| 2010/0240323 | A1 | * | 9/2010 | Qiao et al. | 455/75 |

* cited by examiner

*Primary Examiner* — Jason M Crawford
(74) *Attorney, Agent, or Firm* — Duane Morris LLP (57) ABSTRACT

A conversion circuit includes a first inverter having an input node configured to receive a single-ended signal and second and third inverters each having respective inputs coupled to an output of the first inverter. A fourth inverter has an input coupled to an output of the second inverter and has an output coupled to a first node. A fifth inverter has an input coupled to the first node and an output coupled to a second node to which an output of the third inverter is coupled. Sixth and seventh inverters are configured to respectively output a differential signal based on the single-ended signal. The sixth inverter has an input coupled to the first node, and the seventh inverter has an input coupled to the second node.

15 Claims, 12 Drawing Sheets

SINGLE-TO-DIFFERENTIAL CONVERSION CIRCUIT AND METHOD

FIELD OF DISCLOSURE

The disclosed circuits and methods relate to integrated circuits. More specifically, the disclosed circuits and methods relate to timing circuits.

BACKGROUND

Single-ended to differential ("S2D") circuits are widely use to convert a single timing signal into two differential timing signals. Such circuits are commonly needed when a single clock signal is provided, but differential signals are needed by circuitry of an integrated circuit ("IC"). However, conventional S2D circuits tend to suffer from skew caused by adjacent phases being improperly shifted relative to one another. Such skew may cause improper timing signals in the IC resulting in the circuit improperly functioning.

SUMMARY

In some embodiments, a conversion circuit includes a first inverter having an input node configured to receive a single-ended signal and second and third inverters each having respective inputs coupled to an output of the first inverter. A fourth inverter has an input coupled to an output of the second inverter and has an output coupled to a first node. A fifth inverter has an input coupled to the first node and an output coupled to a second node to which an output of the third inverter is coupled. Sixth and seventh inverters are configured to respectively output a differential signal based on the single-ended signal. The sixth inverter has an input coupled to the first node, and the seventh inverter has an input coupled to the second node.

In some embodiments, a method includes receiving a single-ended clock signal at an input of a first inverter, receiving first and second inverted clock signals at a respective input of second and third inverters, and delaying the first inverted clock signal relative to the second inverted clock signal. A third clock signal is generated from the first inverted clock signal that is delayed relative to the second inverted clock signal. The first inverted clock signal that is delayed relative to the second clock signal is combined with the second clock signal to provide a fourth clock signal. The third and fourth clock signals are output from respective inverters.

In some embodiments, a circuit includes a first inverter having an input node configured to receive a single-ended signal and second and third inverters each having respective inputs coupled to an output of the first inverter. A fourth inverter has an input coupled to an output of the second inverter and having an output coupled to a first node, and a fifth inverter has an input coupled to the first node and an output coupled to a second node to which an output of the third inverter is coupled. A sixth inverter has an input coupled to the first node, and a seventh inverter has an input coupled to the second node. A latch is coupled to respective outputs of the sixth and seventh inverters and is configured to reduce a relative skew between differential signals received from the sixth and seventh inverters.

DETAILED DESCRIPTION

Figure 1A:
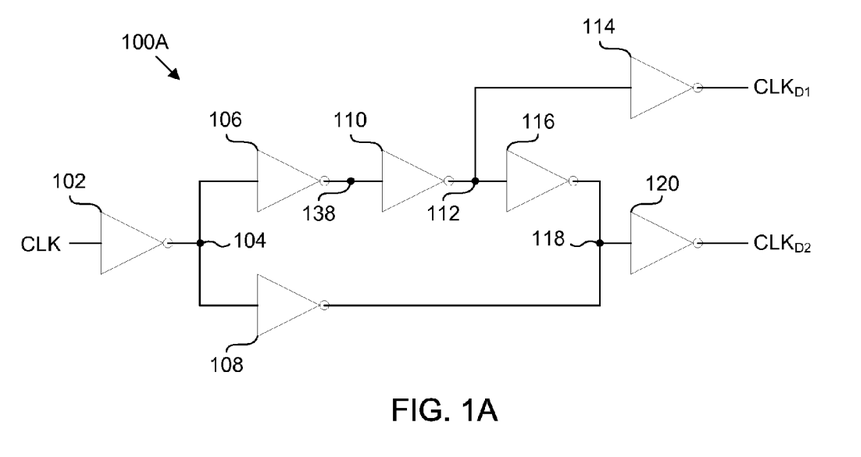
FIG. 1A is a circuit diagram of one example of an improved S2D circuit.

FIG. 1A is a circuit diagram of one example of an improved S2D circuit 100A. As shown in FIG. 1, S2D circuit 100A includes an input inverter 102 having an input configured to receive a single-ended clock signal, CLK. The output of inverter 102 is coupled to node 104, which is coupled to the inputs of inverter 106 and inverter 108. Inverter 106 has its output coupled to the input of inverter 110, which has its output coupled to node 112.

Node 112 is coupled to the inputs of inverter 114 and inverter 116. The output of inverter 114 is used as one of the differential outputs, $CLK_{D1}$, of S2D circuit 100A. Inverter 116 has its output coupled to node 118, which is also coupled to the output of inverter 108 and the input of inverter 120. The output of inverter 120 is used as a second one of the differential outputs, $CLK_{D2}$, of S2D circuit 100A.

Figure 1B:
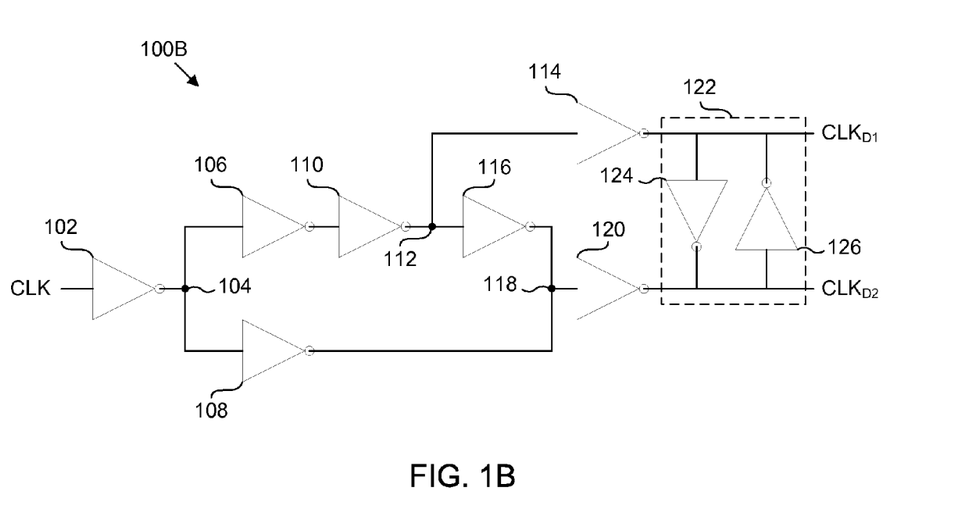
FIG. 1B is a circuit diagram of another example of an improved S2D circuit.

In some embodiments, such as the embodiment illustrated in FIG. 1B, an S2D circuit may include a latch 122 coupled to the outputs of inverters 114 and 120. As shown in FIG. 1B, latch 122 may include a pair of cross-coupled inverters 124 and 126. For example, inverter 124 has an input coupled to the output of inverter 114 and an output coupled to the output of inverter 120. Inverter 126 has its input coupled to the outputs of inverters 120 and 124 and its output coupled to the output of inverter 114 and to the input of inverter 124. Latch 122 assist in further reducing any skew.

Figure 1C:
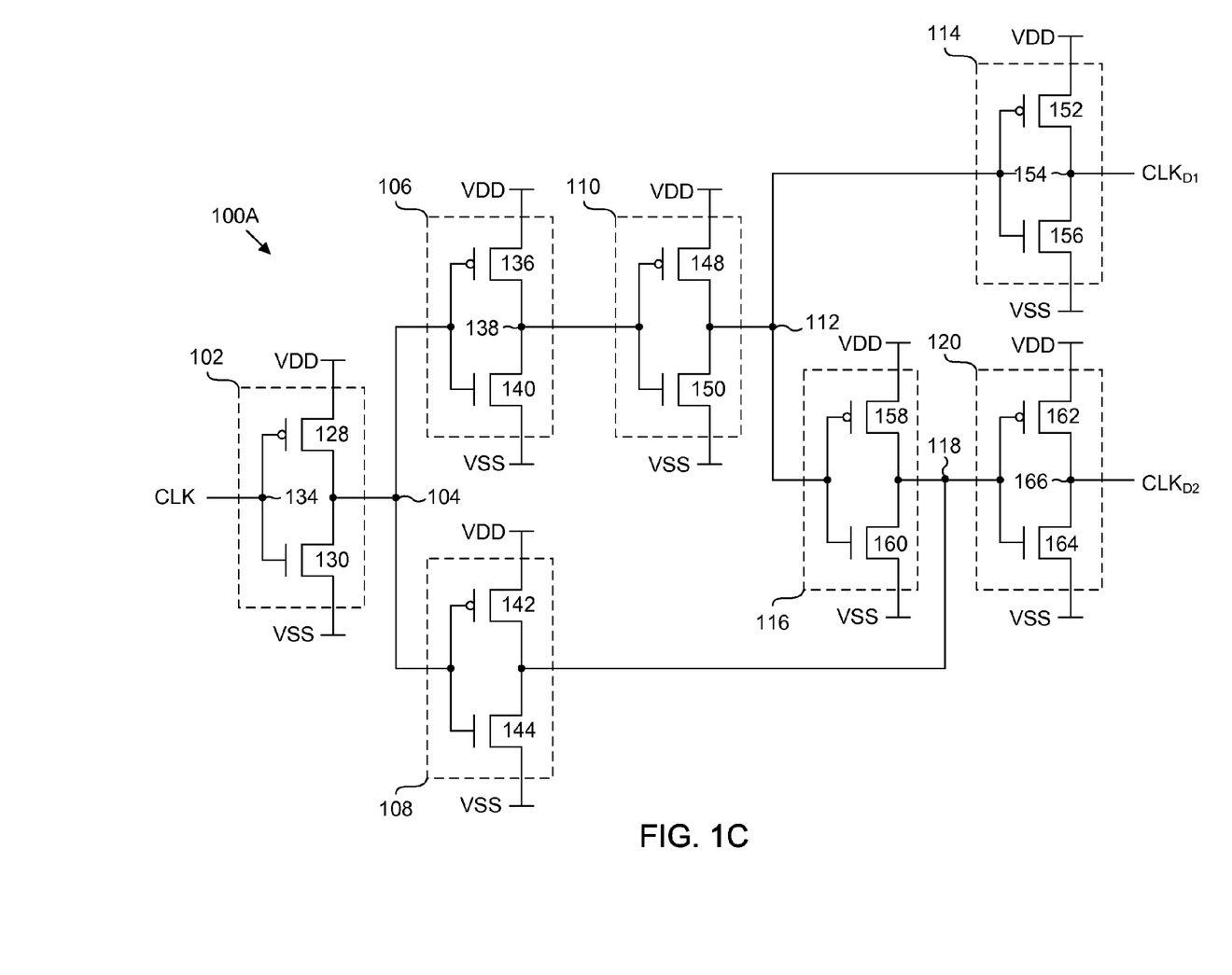
FIG. 1C is a detailed circuit diagram of the S2D circuit illustrated in FIG. 1A implemented using CMOS technology.

S2D circuits 100A and 100B may be implemented using complementary metal oxide semiconductor ("CMOS") technology. For example, FIG. 1C is a circuit diagram of S2D circuit 100A implemented using CMOS technology. As shown in FIG. 1C, inverter 102 includes a p-type metal oxide field effect transistor ("PMOSFET" or "PMOS") 128 and an n-type MOSFET ("NMOS") 130. PMOS 128 has its source coupled to a first supply voltage source node having a voltage set at the operating voltage, VDD, a drain coupled to node 104, and a gate coupled to input node 134. NMOS transistor 130 has its source coupled to a second voltage supply node set at VSS, a drain coupled to node 104, and a gate coupled to input node 134.

Inverter 106 includes a PMOS transistor 136 having a source coupled to VDD, a drain coupled to node 138, and a gate coupled to node 104, which is coupled to the output of inverter 102. Inverter 106 also includes NMOS transistor 140 having a source coupled to VSS, a drain coupled to node 138, and a gate coupled to node 104. PMOS transistor 142 of inverter 108 has a source coupled to VDD, a drain coupled to node 118, and a gate coupled to node 104. NMOS transistor 144 of inverter 108 has a source coupled to VSS, a drain coupled to node 118, and a gate coupled to node 104.

Inverter 110 includes a PMOS transistor 148 having a source coupled to VDD, a drain coupled to node 112, and a gate coupled to node 138, which is the output of inverter 106. NMOS transistor 150 of inverter 110 has a source coupled to VSS, a drain coupled to node 112, and a gate coupled to node 138. Inverter 114 includes a PMOS transistor 152 having a source coupled to VDD, a drain coupled to node 154, which serves as the output of inverter 114 to output differential signal $CLK_{D1}$, and a gate coupled to node 112. NMOS transistor 156 of inverter 114 has its gate coupled to node 112, its source coupled to VSS, and its drain coupled to node 154. Inverter 116 includes a PMOS transistor 158 having a source coupled to VDD, a drain coupled to node 118, and a gate coupled to node 112. NMOS transistor 160 of inverter 116 has its source coupled to VSS, its drain coupled to node 118, and its gate coupled to node 112.

Inverter 120 includes a PMOS transistor 162 coupled in series with an NMOS transistor 164 at node 166, which is used to output differential signal $CLK_{D2}$. PMOS transistor 162 has its gate coupled to node 118, its source coupled to VDD, and its drain coupled to node 166. NMOS transistor 164 has its source coupled to node 118, its source coupled to VSS, and its drain coupled to node 166.

Figure 1D:
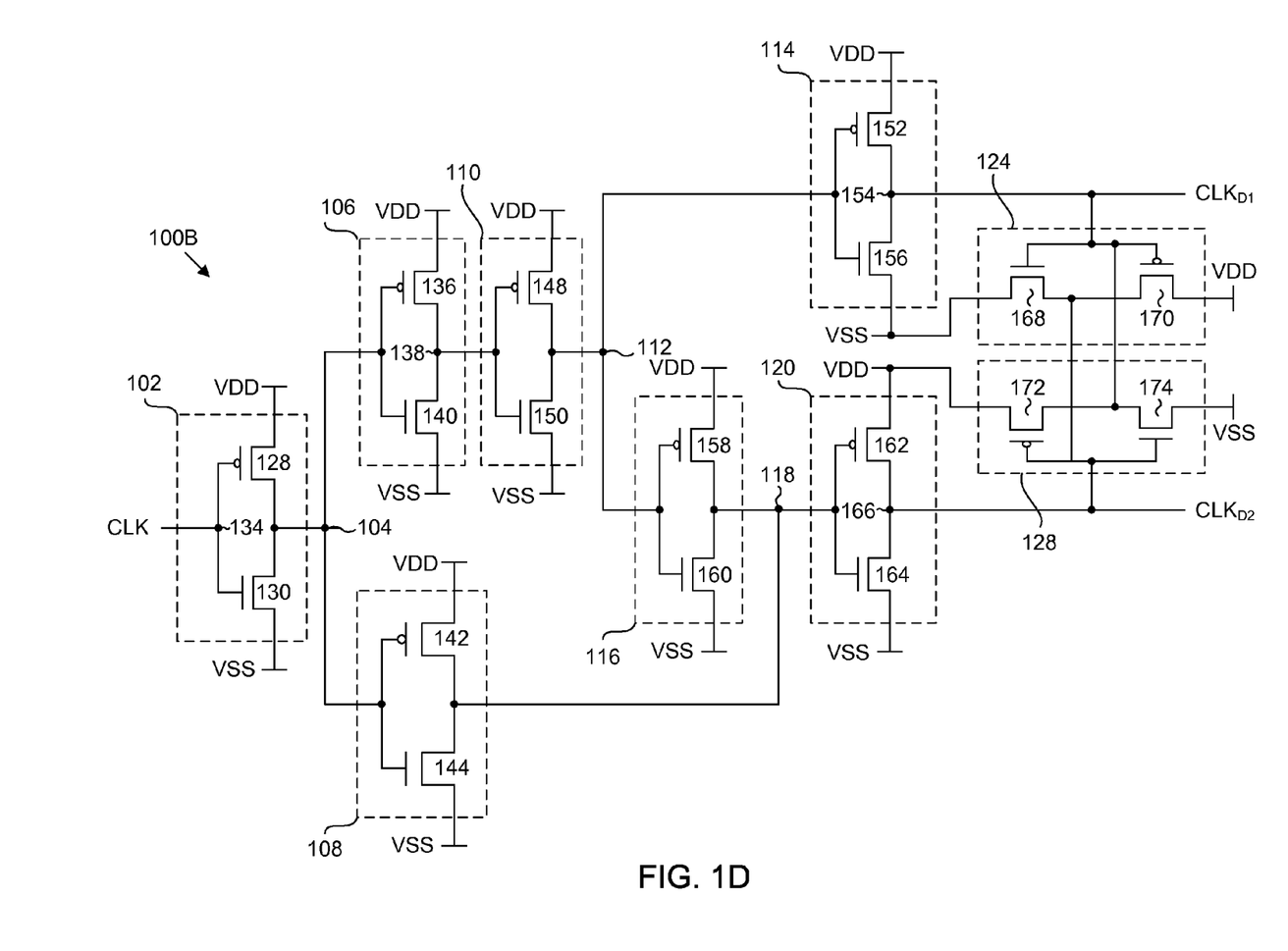
FIG. 1D is a detailed circuit diagram of the S2D circuit illustrated in FIG. 1B implemented using CMOS technology.

FIG. 1D is a detailed circuit diagram of the S2D conversion circuit 100B implemented using CMOS technology. As shown in FIG. 1D, S2D circuit 100B includes an inverter 102 comprising a PMOS transistor 128 and an NMOS transistor 130. PMOS 128 has a source coupled to a first supply voltage source node, which has a voltage set at the operating voltage, VDD. A drain of PMOS transistor 128 is coupled to node 104, and a gate of PMOS transistor 128 is coupled to input node 134. NMOS transistor 130 has its source coupled to a second voltage supply node set at VSS, a drain coupled to node 104, and a gate coupled to input node 134.

Inverter 106 includes a PMOS transistor 136 having a source coupled to VDD, a drain coupled to node 138, and a gate coupled to node 104, which is coupled to the output of inverter 102. Inverter 106 also includes an NMOS transistor 140 having a source coupled to VSS, a drain coupled to node 138, and a gate coupled to node 104. PMOS transistor 142 of inverter 108 has a source coupled to VDD, a drain coupled to node 118, and a gate coupled to node 104. NMOS transistor 144 of inverter 108 has a source coupled to VSS, a drain coupled to node 118, and a gate coupled to node 104.

Inverter 110 includes PMOS transistor 148 having a source coupled to VDD, a drain coupled to node 112, and a gate coupled to node 138. Node 138 functions as the output of inverter 106. NMOS transistor 150 of inverter 110 has a source coupled to VSS, a drain coupled to node 112, and a gate coupled to node 138. Inverter 114 includes a PMOS transistor 152 having a source coupled to supply voltage VDD, a drain coupled to node 154, and a gate coupled to node 112. NMOS transistor 156 has its gate coupled to node 112, its source coupled to VSS, and its drain coupled to node 154. Node 154 serves as the output of inverter 114, which outputs differential signal $CLK_{D1}$. Inverter 116 includes a PMOS transistor 158 having a source coupled to supply voltage VDD, a drain coupled to node 118, and a gate coupled to node 112. NMOS transistor 160 of inverter 116 has its source coupled to VSS, its drain coupled to node 118, and its gate coupled to node 112.

Inverter 120 includes a PMOS transistor 162 coupled in series with an NMOS transistor 164 at node 166. Node 166 serves as the output of inverter 120 and outputs differential signal $CLK_{D2}$. PMOS transistor 162 has its gate coupled to node 118, its source coupled to VDD, and its drain coupled to node 166. NMOS transistor 164 has its source coupled to node 118, its source coupled to VSS, and its drain coupled to node 166.

Cross-coupled inverters 124 and 128 are coupled between nodes 154 and 166 and are configured to reduce the skew of $CLK_{D1}$ and $CLK_{D2}$. Inverter 124 includes an NMOS transistor 168 having a gate coupled to node 154, a drain coupled to node 166, and a source coupled to low voltage supply VSS. PMOS transistor 170 of inverter 124 has a source coupled to high voltage supply VDD, a drain coupled to node 166, and a gate coupled to node 154. Inverter 128 includes a PMOS transistor 172 and an NMOS transistor 174. PMOS transistor 172 has its gate coupled to node 166, its drain coupled to node 154, and its source coupled to supply voltage VDD. NMOS transistor 174 has its source coupled to supply voltage VSS, its drain coupled to node 154, and its gate coupled to node 166.

Figure 2:
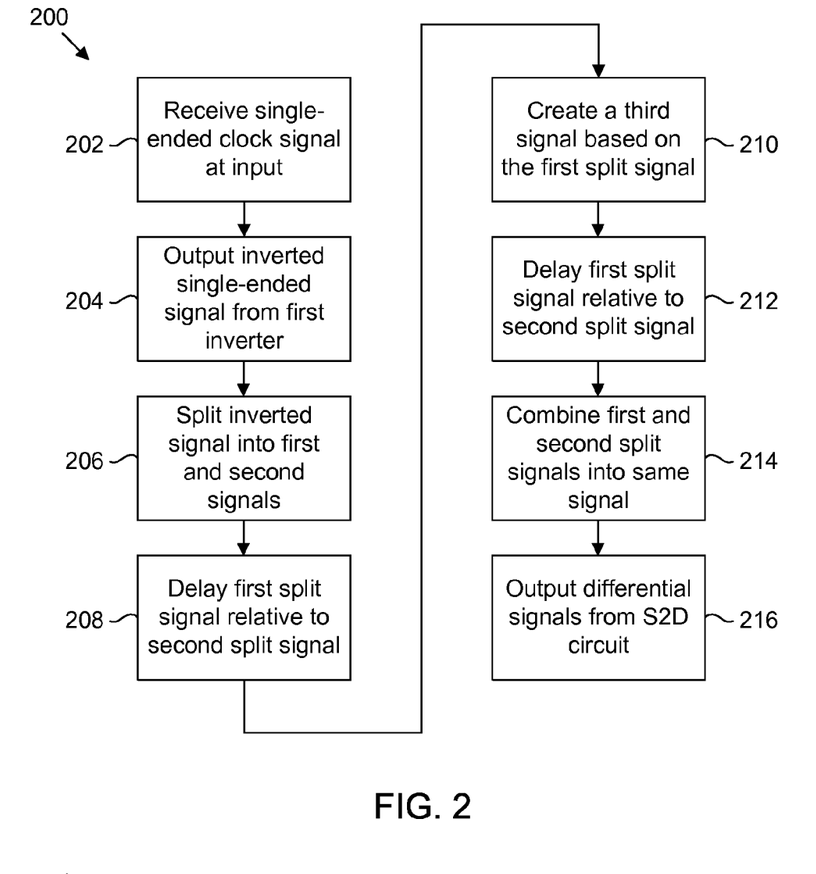
FIG. 2 is a flow diagram of one example of method performed by the S2D circuits in accordance with FIGS. 1B and 1D.
Figure 3:
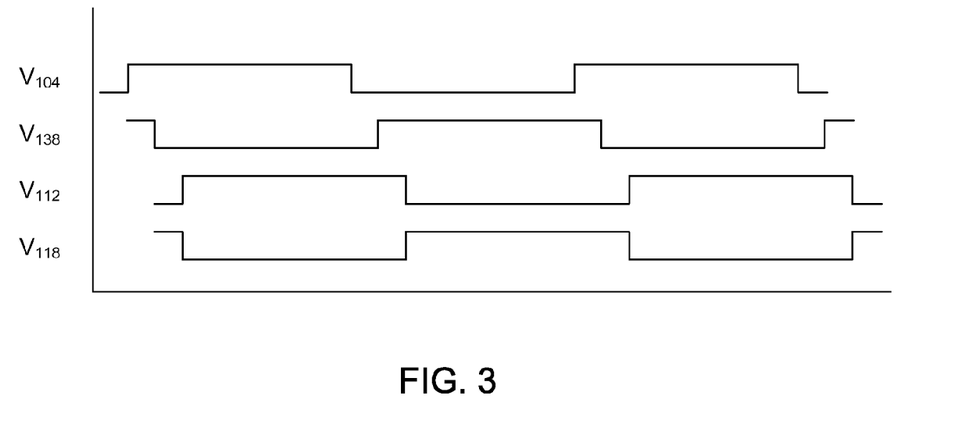
FIG. 3 is one example of a timing diagram of various nodes of an improved S2D circuit.

The operation of S2D circuit 100B is described with reference to FIG. 2, which is a flow diagram of one example of a method 200 of converting a single-ended signal to differential signals. FIG. 3 is a timing diagram of various voltages of S2D circuit 100B during operation. Referring first to FIG. 2, a single-ended clock signal is received at an input of S2D circuit 100B at block 202. At block 204, the single-ended input signal is inverted by inverter 102 and output to node 104.

The inverted single-ended input signal is split into first and second signals at block 206 as the signal received at node 104 passes through inverter 106 and inverter 108, which are coupled in parallel with each other. At block 208, the first split signal is delayed relative to the second split signal. For example, the signal output by inverter 106 passes through inverter 112, which delays the signal relative to the signal output by inverter 108.

At block 210, create a third signal based on the first split signal. For example, the signal received at node 112, which is coupled to the output of inverter 110, is received at the respective inputs of inverter 114 and inverter 116. The first signal is delayed again relative to the second signal at block 212 as the first signal passes through inverter 116 and is then combined with the second signal at block 214. The differential signals are output by the S2D circuit. For example, inverter 114 outputs one differential signal, and inverter 116 outputs another differential signal. Inverters 124 and 128 of latch 122 assist in removing skew of the signals output by inverters 114 and 120.

FIG. 3 is one example of a timing diagram of various nodes of an S2D circuit 100A. For example, each of the inverters of S2D circuit 100A may have a delay of approximately $\Delta T$ such that the path delay from node 104 to node 112 is approximately $2*\Delta T$ and the delay from node 104 to node 118 is an interpolation of $\Delta T$ and $3*\Delta T$, which may be equal to approximately $2*\Delta T$. The delay of $\Delta T$ of each of the inverters can be matched by using the same gate size for each of the transistors from which the inverters are fabricated, which enables a precise interpolation and a smaller output skew compared to conventional s2d circuits. As shown in FIG. 3, voltages at nodes 112 and 118, i.e., $V_{112}$ and $V_{118}$, are approximately opposite one another such that the outputs $CLK_{D1}$ and $CLK_{D2}$ will also be opposite one another as each is delayed by a respective inverter 114 and 120.

Figure 4A:
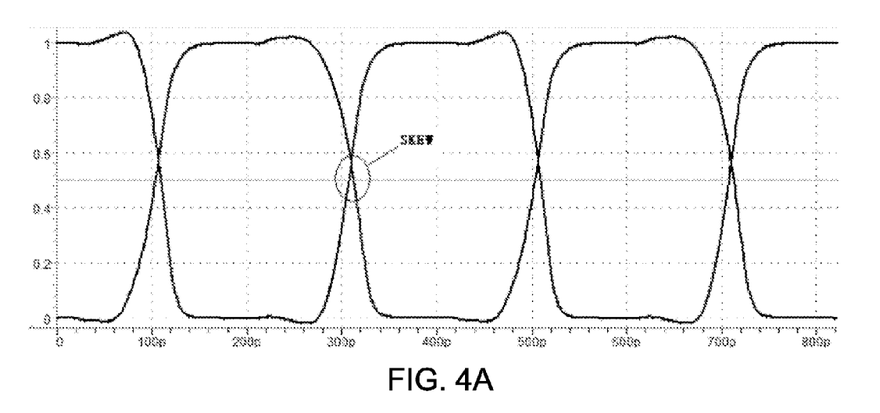
FIG. 4A is a simulated timing diagram of output signals of a conventional S2D circuit.
Figure 4B:
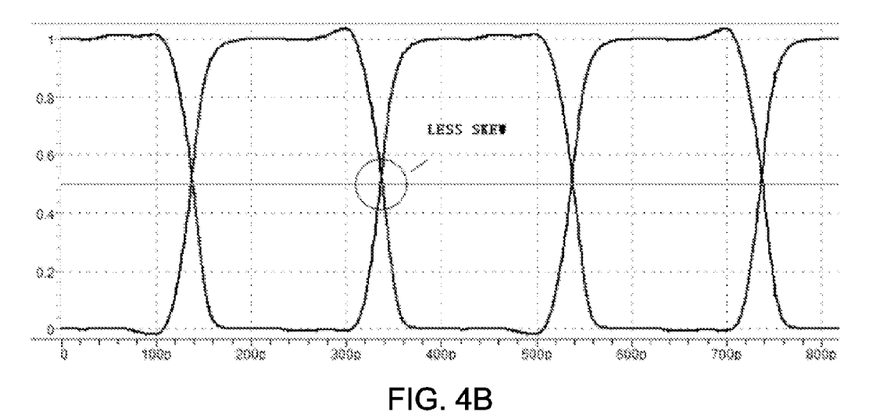
FIG. 4B is a simulated timing diagram of output signals of an improved S2D circuit.

The improved S2D circuits described above have less skew compared to conventional S2D circuits. For example, FIG. 4A illustrates the differential output signals of a conventional S2D circuit, and FIG. 4B illustrates the differential output signals of S2D circuit 100B. As shown in FIG. 4A, the signals cross at approximately 0.55 at approximately 310 ps. In contrast, the signals of S2D circuit 100B cross at approximately 0.5 at approximately 335 ps, which is an improvement compared to crossing at 0.55.

Figure 5:
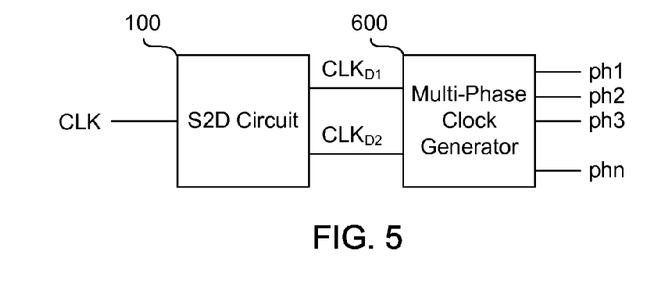
FIG. 5 is a block diagram of one example of an improved clock circuit including an S2D circuit and a multi-phase clock generator.

The improved S2D circuit may be combined with a multi-phase clock generator to provide a multi-phase clock generator having reduced skew. For example and as illustrated in FIG. 5, clock circuit 500 may include an S2D circuit 100, such as S2D circuit 100A, 100B, that receives a clock signal CLK and provide differential clock signals $CLK_{D1}$ and $CLK_{D2}$ to a multi-phase clock generator 600.

Figure 6:
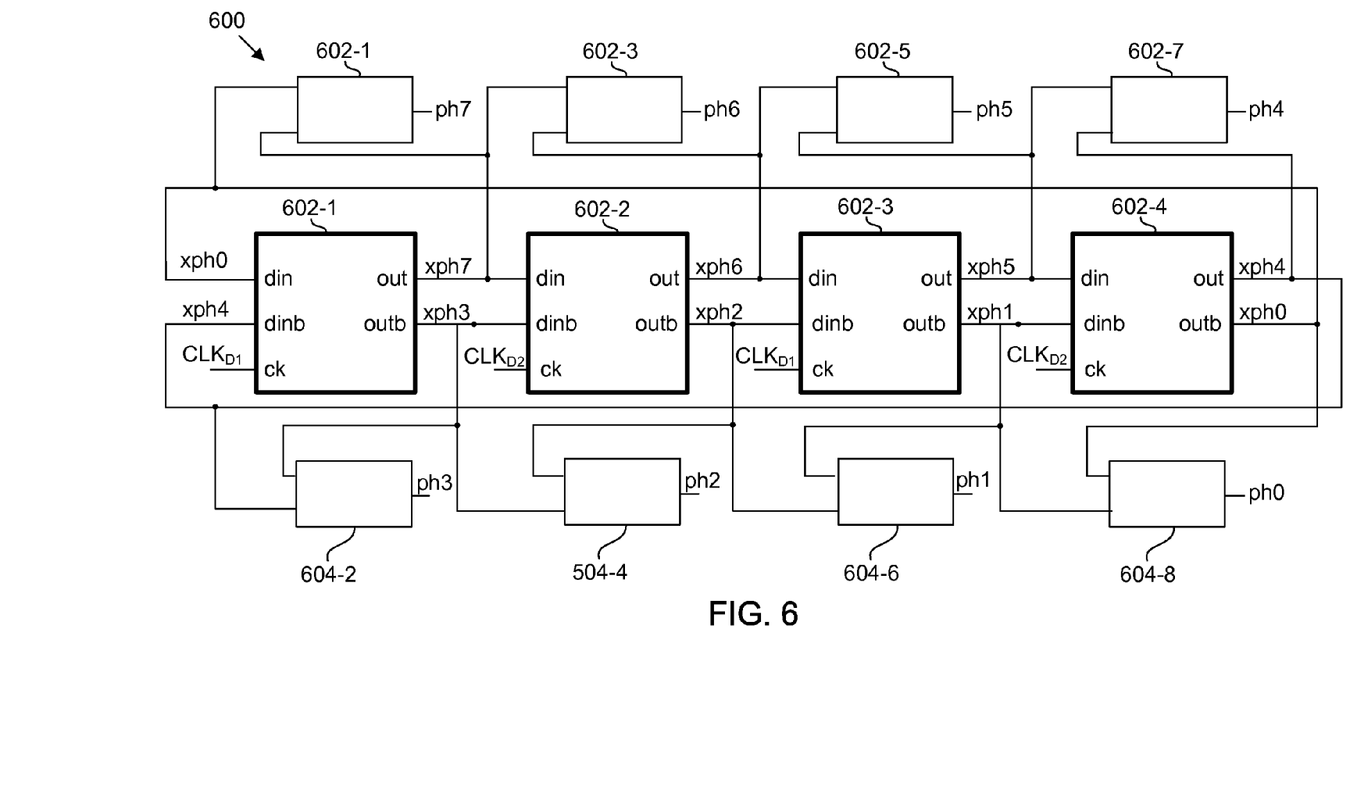
FIG. 6 is a block diagram of one example of an improved multi-phase clock generator in accordance with the improved clock circuit illustrated in FIG. 5.

FIG. 6 illustrates one example of an improved multi-phase clock generator 600 that includes a plurality of latches 602 arranged in series with each other. Although four latches 602 are illustrated, one skilled in the art will understand that any number of latches may be implemented. Each of the one or more latches 602 is coupled to one or more phase interpolation circuits 604. Latches 602 are configured to output at least one intermediate clock phase signal in response to receiving an input clock signal, e.g., at least one of $CLK_{D1}$ and $CLK_{D2}$. Phase interpolation circuits 604 output clock phase signals based on a pair of intermediate clock phase signals.

As shown in FIG. 6, latch 602-1 receives clock signal $CLK_{D1}$ and intermediate clock phase signals, xph0 and xph4, at its inputs. Intermediate clock phase signals xph0 and xph4 are output from the last latch 602-4 in the series of latches of multi-phase clock generator 600. Latch 602-2 receives clock signal $CLK_{D2}$, which is the inverse of clock signal $CLK_{D1}$, and intermediate clock phase signals xph7 and xph3, which are output from latch 602-1. Latch 602-2 outputs intermediate clock phase signals xph6 and xph2 to latch 602-3, which also receives clock signal $CLK_{D1}$. Latch 602-3 outputs intermediate clock phase signals xph5 and xph1 to latch 602-4 in response to receiving clock signal $CLK_{D2}$ and intermediate clock phase signals xph6 and xph2. Latch 602-4 outputs intermediate clock phase signals xph4 and xph0 in response to receiving intermediate clock phase signals xph5 and xph1 from latch 602-3 and receiving clock signal $CLK_{D2}$.

Phase interpolation circuits 604 each receive a pair of intermediate clock phase signals and in response output a clock phase signal that is an interpolation of the pair of intermediate clock phase signals. For example, phase interpolation circuit 604-1 receives intermediate clock phase signals xph0 from latch 602-4 and xph7 from latch 602-1 and outputs clock phase signal ph7. Phase interpolation circuit 604-2 receives intermediate clock phase signal xph4 from latch 602-4 and intermediate clock phase signal xph3 from latch 602-1 and in response outputs clock phase signal ph3.

Clock phase signal ph6 is output from phase interpolation circuit 604-3 in response to receiving intermediate clock phase signal xph7 from latch 602-1 and intermediate clock phase signal xph6 from latch 602-2. Clock phase signal ph2 is output from phase interpolation circuit 604-4 in response to receiving intermediate clock phase signal xph3 from latch 602-1 and intermediate clock phase signal xph2 from latch 602-2.

Phase interpolation circuit 604-5 outputs clock phase signal ph5 in response to receiving intermediate clock phase signal xph6 from latch 602-2 and intermediate clock phase signal pxh5 from latch 602-3. Phase interpolation circuit 604-6 outputs clock phase signal xph1 based on an interpolation of intermediate clock phase signal xph2 received from latch 602-2 and intermediate clock phase signal xph1 received from latch 602-3.

Clock phase signal ph4 is output from phase interpolation circuit 604-7 based on an interpolation of intermediate clock phase signal xph5, which is received from latch 602-3, and intermediate clock phase signal xph4, which is received from latch 602-4. Phase interpolation circuit 604-8 outputs clock phase signal ph0 in response to receiving intermediate clock phase signal xph1 from latch 602-3 and intermediate clock phase signal xph0 from latch 602-4.

Figure 7A:
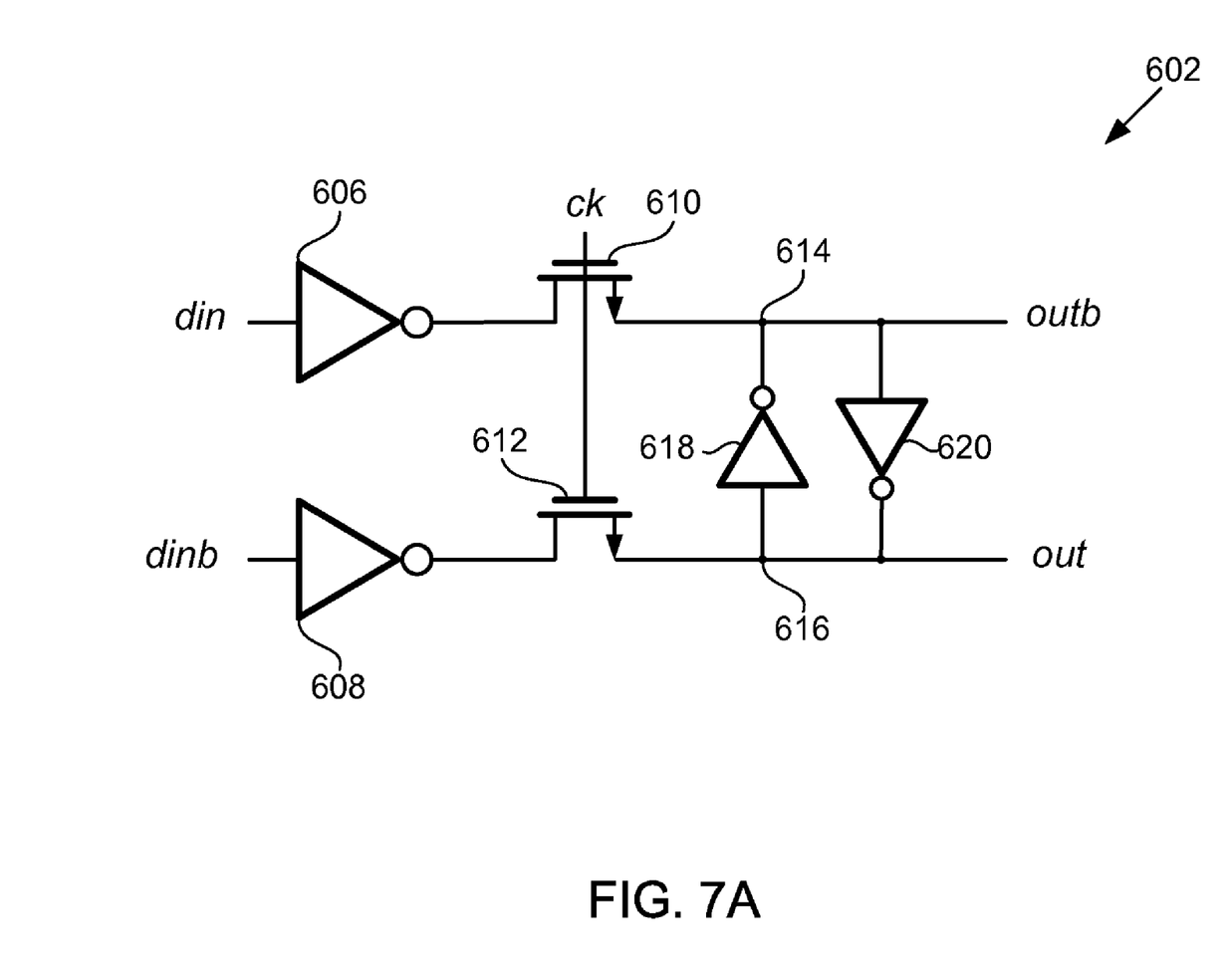
FIG. 7A illustrates one example of a latch in accordance with the multi-phase clock generator illustrated in FIG. 6.

FIG. 7A illustrates one example of a latch 602 in accordance with the multi-phase clock generator 600 illustrated in FIG. 6 and clock circuit 500 illustrated in FIG. 5. As shown in FIG. 7A, latch 602 includes a first inverter 606 having an input, din, and a second inverter 608 having an input, dinb. The outputs of inverters 606 and 608 are respectively coupled to the drain of NMOS transistors 610 and 612. The gates of transistors 610 and 612 are configured to receive one of the clock signals, e.g., $CLK_{D1}$ or $CLK_{D2}$, which controls the turning on and off of transistors 610 and 612. The source of transistor 610 is coupled to node 614, which serves as an output, outb, of latch 602. The source of transistor 612 is coupled to node 616, which also serves as an output, out, of latch 602. A pair of cross-coupled inverters 618 and 620 may be coupled between nodes 614 and 616 to assist in reducing the skew of the output signals.

Figure 7B:
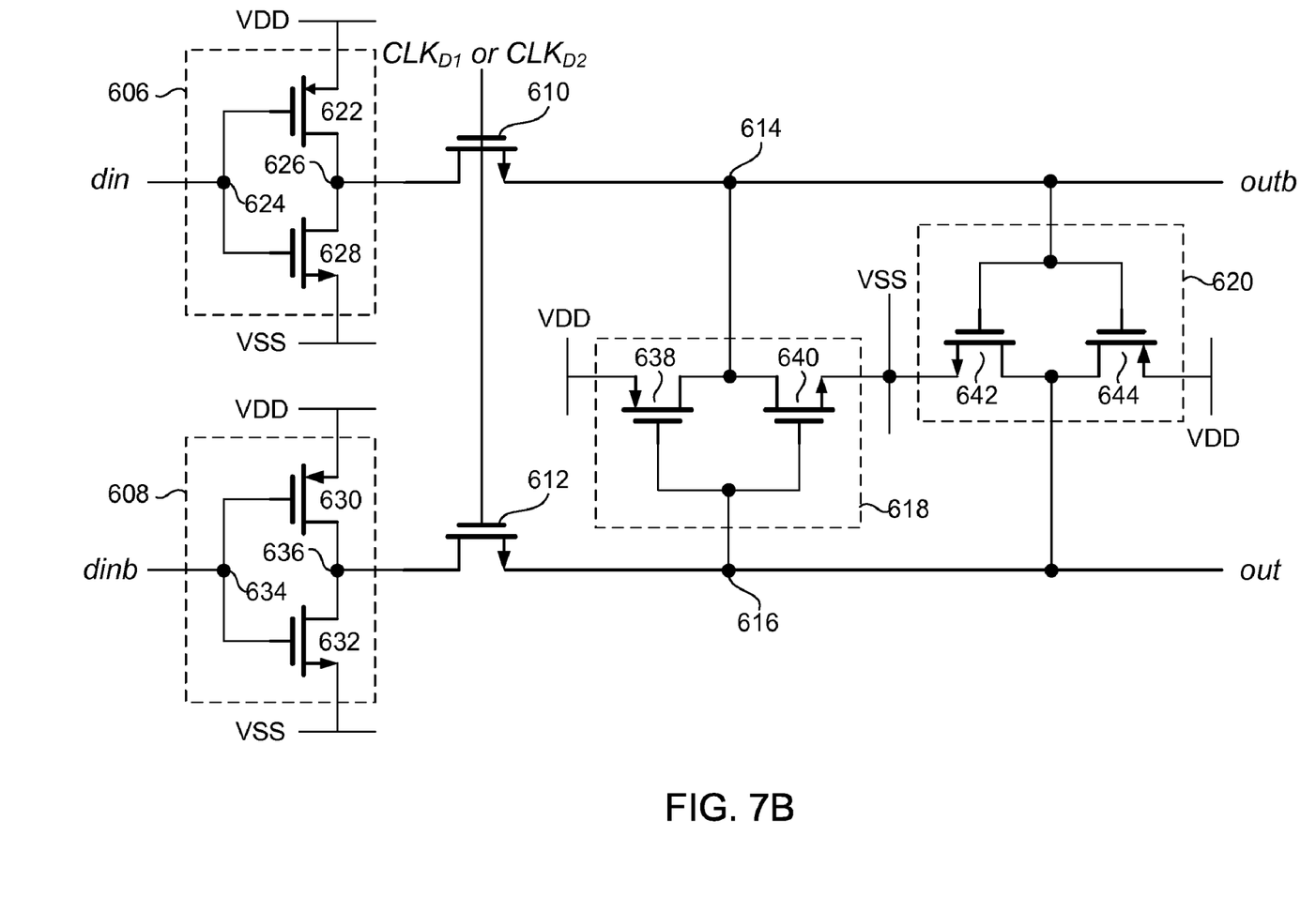
FIG. 7B illustrates one example of the latch illustrated in FIG. 7A formed using complementary metal oxide semiconductor technology.

Latches 602 may be formed using complementary metal oxide semiconductor ("CMOS") technology as illustrated in FIG. 7B. As shown in FIG. 7B, inverter 606 includes a PMOS transistor 622 having a gate coupled to input node 624, a source coupled to voltage supply rail VDD, and a drain coupled to output node 626. NMOS transistor 628 has its source coupled to a low voltage supply rail, which may be set at VSS, its gate coupled to input node 624, and its drain coupled to output node 626, which is coupled to the drain of transistor 610.

Inverter 608 also includes a PMOS transistor 630 and an NMOS transistor 632. Transistor 630 has its gate coupled to input node 634, its source coupled to a high voltage supply rail, which may be set at VDD, and its drain coupled to output node 636. Transistor 632 has its gate coupled to input node 634, its source coupled to a low voltage supply rail, and its drain coupled to output node 636, which is coupled to the drain of transistor 612.

Inverter 618 includes an PMOS transistor 638 having its gate coupled to input node 616, its source coupled to a high voltage supply rail, and its drain coupled to output node 614. NMOS transistor 640 has its gate coupled to node 616, its source coupled to a low voltage power supply rail, and its drain coupled to node 614. Inverter 620 also includes an NMOS transistor 142 and a PMOS transistor 144. NMOS transistor 142 has its source coupled to a low voltage power supply rail, its gate coupled to node 114, and its drain coupled to node 116. PMOS transistor has its source coupled to a high voltage power supply line, its drain coupled to node 116, and its gate coupled to node 614.

Figure 8A:
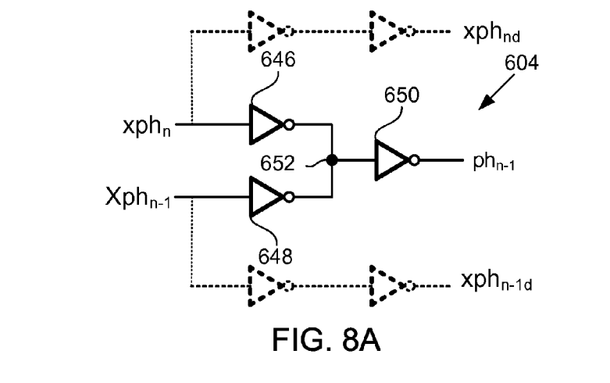
FIG. 8A illustrates one example of a phase interpolation circuit in accordance with the multi-phase clock generator illustrated in FIG. 6.

One example of a phase interpolation circuit 604 is illustrated in FIG. 8A. As shown in FIG. 8A, phase interpolation circuit 604 includes a pair of input inverters 646 and 648 each having an output coupled to an input of output inverter 650. Each input inverter 646, 648 receives a respective intermediate clock phase signal at its input. For example, inverter 646 receives intermediate clock phase signal, $xph_n$, at its input and inverter 648 receives a next consecutive intermediate clock phase signal, $xph_{n-1}$, at its input. The intermediate clock phase signals received at the inputs of input inverters 646 and 648 are received from latches 602 as shown in FIG. 6.

Figure 9A:
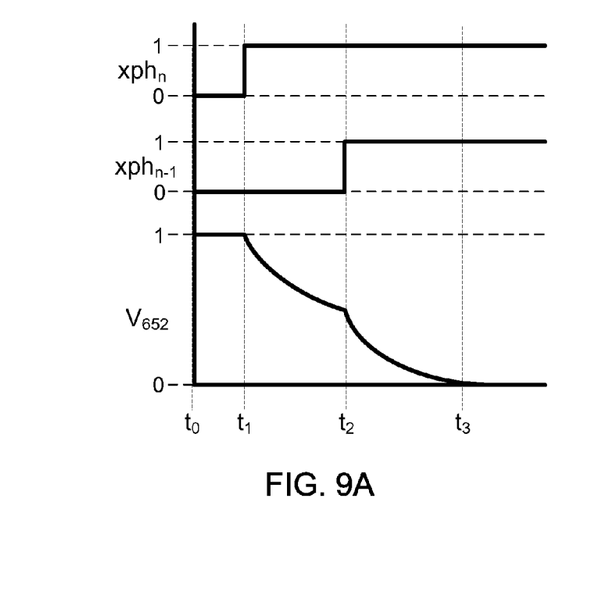
FIG. 9A is a timing diagram illustrating the voltage transitions at different nodes of the phase interpolation circuit illustrated in FIG. 8A.

Each input inverter 646, 648 has its output coupled to node 652, which is coupled to the input of output inverter 650. Output inverter 650 outputs a clock phase signal that is an interpolation of the two intermediate clock phase signals, $xph_n$ and $xph_{n-1}$, received at the inputs of input inverters 646 and 648. For example, FIG. 9A illustrates voltage levels of intermediate clock phase signals, $xph_n$ and $xph_{n-1}$, received at the input of input inverters 646 and 648 and the corresponding voltage at node 652, $V_{652}$. As shown in FIG. 9A, intermediate phase signals $xph_n$ and $xph_{n-1}$ are at logic zeroes at time $t_0$, which results in the voltage at node 652, $V_{652}$, being a logic one.

At time $t_1$, intermediate clock phase signal $xph_n$ transitions from a logic zero to a logic one while intermediate clock phase signal $xph_{n-1}$ is maintained at a logic zero. The transitioning of intermediate clock phase signal $xph_n$ from a logic zero to a logic one begins to pull down voltage $V_{652}$. At time $t_2$, intermediate clock phase signal $xph_n$ is maintained at a logic one and intermediate clock phase signal $xph_{n-1}$ transitions from a logic zero to a logic one, which results in the voltage $V_{652}$ to continue to be pulled towards a logic one. At time $t_3$, voltage $V_{652}$ reaches a logic zero potential while intermediate clock phase signals $xph_n$ and $xph_{n-1}$ are maintained at logic ones.

Figure 9B:
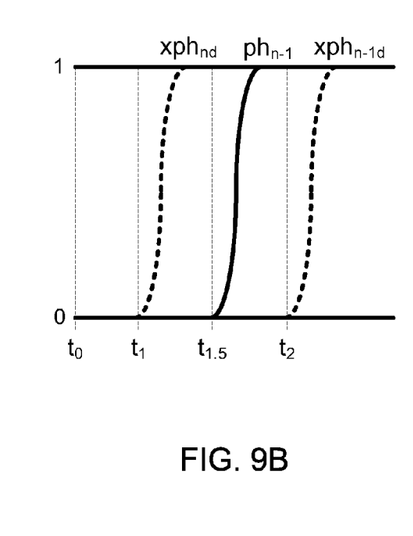
FIG. 9B is a timing diagram illustrating one example of an interpolation of two intermediate clock phase signals into a clock phase signal in accordance with the phase interpolation circuit illustrated in FIG. 8A.

FIG. 9B illustrates the relationship between delayed intermediate clock phase signals $xph_{nd}$ and $xph_{n-1d}$ and the resultant clock phase signal $ph_{n-1}$. As shown in FIG. 9B, clock phase signal $xph_{n-1}$ is an interpolation of intermediate clock phase signals $xph_n$ and $xph_{n-1}$ such that clock phase signal $ph_{n-1}$ transitions from a logic zero to a logic one at time $t_{1.5}$ that is approximately half way between the times when the delayed intermediate clock phase signals $xph_{nd}$ and $xph_{n-1d}$ transition from logic zeroes to logic ones. The dotted paths in FIG. 9B are shown for illustrative purposes of the interpolation and do not need to be implemented.

Figure 8B:
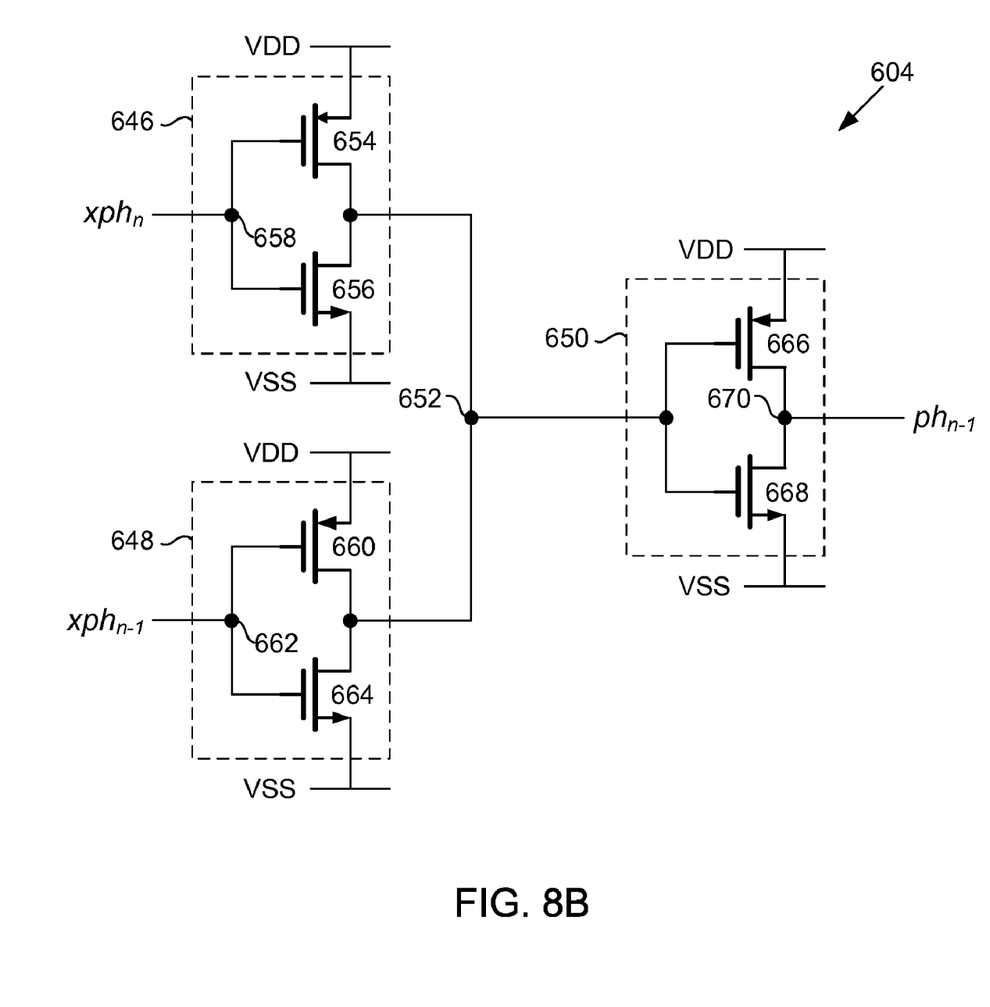
FIG. 8B illustrates one example of the phase interpolation circuit illustrated in FIG. 8A formed using complementary metal oxide semiconductor technology.

Phase interpolation circuits 604 may also be formed using CMOS technology as illustrated in FIG. 8B. As shown in FIG. 8B, inverter 646 includes a PMOS transistor 654 having a source coupled to a high voltage supply rail, a drain coupled to node 652, and a gate coupled to input node 658, which is configured to receive intermediate clock phase signal $xph_n$. Transistor 656 has its source coupled to a low voltage supply rail, a drain coupled to node 652 and its gate coupled to input node 658. Input node 658 of transistor 646 may be coupled to one of nodes 614 or 616 of latch 602 (FIGS. 7A and 7B) such that inverter 646 receives intermediate clock phase signal $xph_n$.

Inverter 648 includes a PMOS transistor 660 having its gate coupled to input node 662, its drain coupled to node 652, and its source coupled to a high voltage supply rail. NMOS transistor 664 has its gate coupled to input node 662, its source coupled to a low voltage supply rail, and its drain coupled to node 652. Input node 662 of inverter 648 may be coupled to one of nodes 614 or 616 of latch 602 (FIGS. 7A and 7B) such that inverter 648 receives intermediate clock phase signal $xph_{n-1}$.

Inverter 650 includes a PMOS transistor 666 and an NMOS transistor 668, which have their drains coupled together at output node 670. The source of transistor 666 is coupled to a high voltage supply rail, and the gate of transistor 666 is coupled to node 652. Transistor 668 has its source coupled to a low voltage supply rail and its gate coupled to node 652. Node 670 outputs clock phase signal $ph_{n-1}$.

The operation of multi-phase clock generator 600 is described with reference to FIG. 6, which is a flow diagram of one example of a method 600 of generating multi-phase clock signals. As will be understood by one skilled in the art, methods 200 and 1000 may be combined into a single method such that S2D circuit 100 generates differential clock signals $CLK_{D1}$ and $CLK_{D2}$ from clock signal CLK and provides the differential signals to multi-phase clock generator 600 as illustrated in FIGS. 5 and 6.

Figure 10:
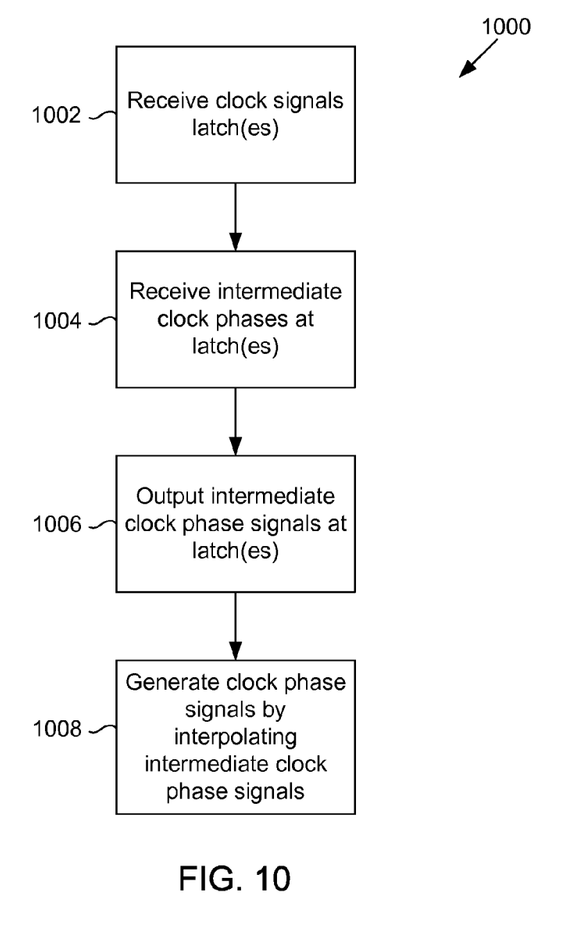
FIG. 10 is a flow diagram of one example of a method of generating multi-phase clock signals.

Referring again to FIG. 10, one or more clock signals are received at one or more latches 602 at block 1002. For example, latches 602-1 and 602-2 in FIG. 6 may receive clock signal $CLK_{D1}$, and latches 602-2 and 602-4 may received clock signal $CLK_{D2}$. As shown in FIGS. 7A and 7B, clock signals $CLK_{D1}$ and $CLK_{D2}$ may be received at the gates of transistors 610 and 612 of a latch 602.

At block 1004, one or more intermediate clock signals are received at one or more latches 602. For example, latch 602-1, which may be the first latch of the multi-phase clock generator 600, may receive a pair of intermediate clock phase signals from the last latch of the multi-phase clock generator 600, e.g., latch 602-4. However, one skilled in the art will understand that multi-phase clock generator may include one or more latches 602. For example, latch 602-1 may be the only latch 602 such that the output of latch 602-1 may be fed back to the inputs of latch 602-1. Latch 602-2 may receive intermediate clock phase signals from latch 602-1, latch 602-3 may receive intermediate clock phase signals from latch 602-3, and latch 602-4 may received intermediate clock phase signals from latch 604-3.

At block 1006, one or more intermediate clock phase signals are generated. As described above, the intermediate clock phase signals are generated by each of the latches 602 of the multi-phase clock generator 600 in response to the clock signal and the intermediate clock phase signals received at the inputs, i.e., the intermediate clock phase signals output in response to a previous clock pulse.

For example, one intermediate clock phase signal is received at node 624 of inverter 606 and another intermediate clock phase signal is received at node 634 of inverter 608. A clock signal, e.g., $CLK_{D1}$ or $CLK_{D2}$, is received at the gate of transistors 610 and 612. Transistors 610 and 612 are turned into current-conducting 'on' states when the clock signal, e.g., $CLK_{D1}$ or $CLK_{D2}$, is a logic one. With transistors 610 and 612 on, the respective outputs of inverters 606 and 608 are respectively coupled to output nodes 614 and 616 of latch 602 such that the signal output to node 614 is a delayed inversion of the signal received at the input of inverter 606 and signal output to node 616 is a delayed inversion of the signal received at the input of inverter 608.

If, for example, the voltage at node 624 of inverter 606 is a logic one, then transistor 622 is turned off and transistor 628 is turned on such that VSS is coupled to node 626. The voltage of VSS is coupled through transistor 610 to node 614 to provide a first intermediate clock phase signal that is a delayed inversion of the signal received at node 624. If the voltage at node 624 of inverter 606 is a logic zero, then transistor 622 is turned on and transistor 628 is turned off such that VDD is coupled to node 626. The voltage of VSS is coupled through transistor 610 to node 614 to provide a first intermediate clock phase signal that is a delayed inversion of the signal received at node 624. The operation of inverter 608, which provides a second intermediate clock phase signal, is similar to the operation of inverter 606 in response to receiving a signal at node 634.

Inverters 618 and 620 assist in developing the signal at nodes 614 and 616. For example, if a logic one develops at node 614, then transistor 642 of inverter 620 turns on and transistor 644 of inverter 620 turns off such that node 616 is coupled to the voltage of VSS. A logic zero developing at node 616 results in transistor 638 of inverter 618 turning on and transistor 640 of inverter 618 turning off such that node 614 is coupled to VDD.

At block 1008, phase interpolation circuits 604 interpolate the intermediate clock phase signals to generate clock signals. As best seen in FIG. 8B, phase interpolation circuits receive a first intermediate clock phase signal at node 658, which is the input node of transistor 646, and a second intermediate clock phase signal at node 662, which is the input node of transistor 648. If the intermediate clock phase signal received at node 658 is a logic zero, then transistor 656 is in a non-current-conducting 'off' state and transistor 654 is turned on such that VDD is coupled to node 652 through transistor 654 to begin pulling up the voltage at node 652.

If the intermediate clock phase signal received at node 662 is a logic zero, then transistor 660 is turned on and transistor 664 is turned off such that VDD is coupled to node 652. When inverter 646 outputs a logic zero and inverter 648 outputs a logic one, which may happen for a period of time, the voltage at node 652 is between the voltage of VDD and VSS. When inverters 646 and 648 output the same voltage potential, the voltage at node 652 transitions to one of VDD or VSS.

The voltage at node 652 is received by inverter 650. If the voltage at node 652 is a logic one, then the transistor 668 is turned on and transistor 666 is turned off such that VSS is coupled to output node 670. In contrast, if the voltage at node 652 is a logic zero, then the transistor 666 is turned on and transistor 668 is turned off such that VDD is coupled to output node 670. In this manner, phase interpolation circuit 604 interpolates a pair of intermediate clock phase signals into a clock phase signal.

Figure 11:
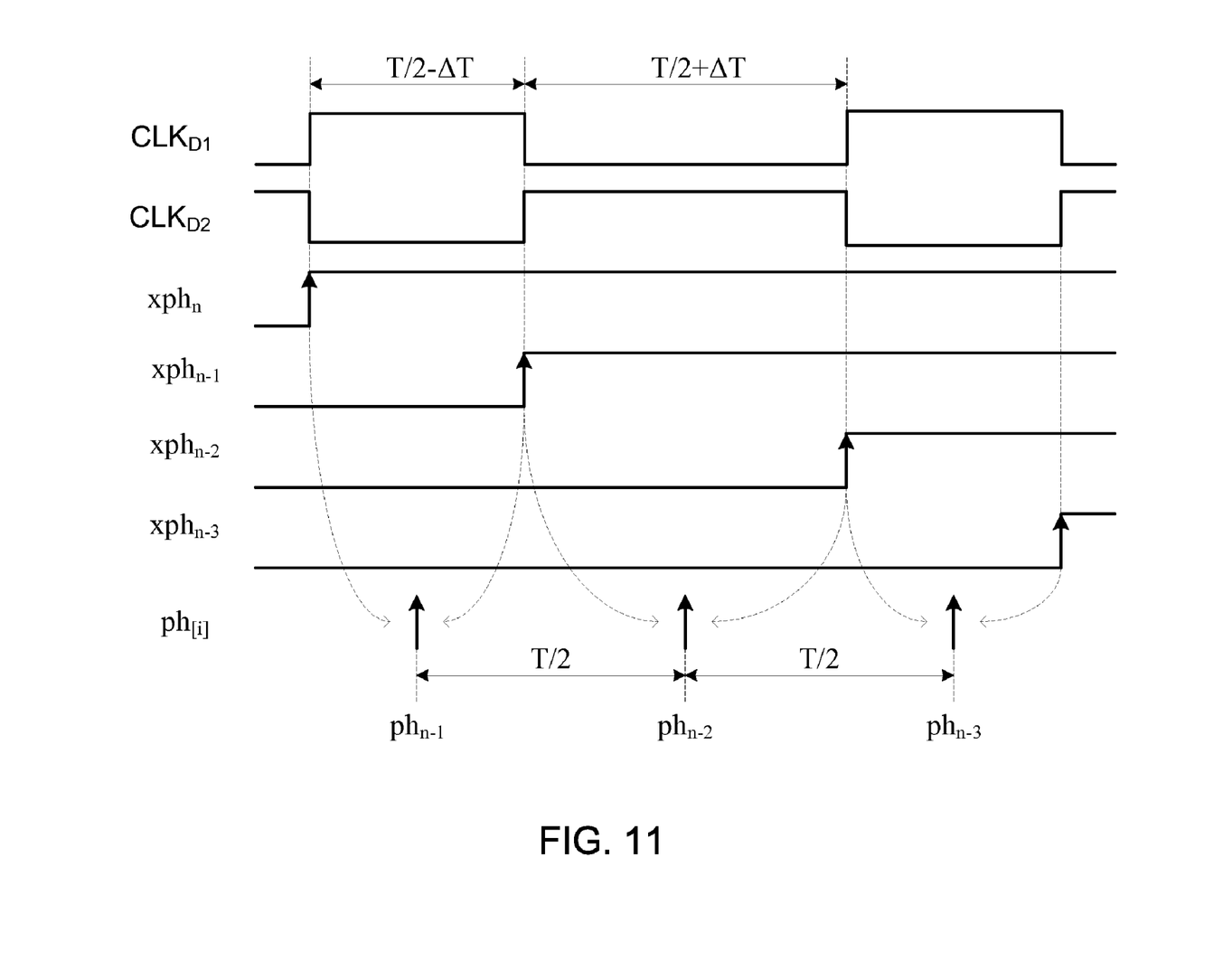
FIG. 11 is a timing diagram illustrating how the phase interpolation circuits reduce skew due to duty cycle distortion.

The multi-phase clock generator 600 that includes phase interpolation circuits 604 advantageously reduces any skew due to duty cycle distortion of input clock signals $CLK_{D1}$ and $CLK_{D2}$, i.e., any difference between the time a clock signal is high and the time the same clock signal is low. For example, FIG. 11 illustrates a pair of input clock signals $CLK_{D1}$ and $CLK_{D2}$ each having duty cycle distortion. As shown in FIG. 11, clock signal $CLK_{D1}$ is a logic one for a shorter period of time than it is a logic zero. Conversely, clock signal $CLK_{D2}$ is a logic one for a longer period of time than it is a logic one.

The adjacent intermediate clock phase signals of multi-phase clock generator 600 are triggered by the rising edges of clock signals $CLK_{D1}$ and $CLK_{D2}$ such that any duty cycle distortion will deviate with a phase offset of $\Delta T$, i.e., $T/2-\Delta T$ and $T/2+\Delta T$. However, such duty-cycle distortion is substantially eliminated by the interpolating the adjacent phases by phase interpolation circuits 104 as the period of the resultant interpolation is equal to:

$$\frac{\left(\frac{T}{2} - \Delta T\right) + \left(\frac{T}{2} + \Delta T\right)}{2} = \frac{T}{2}$$

As shown in FIG. 11, the delay of the adjacent resultant interpolated signals, $ph_{n-1}$ and $ph_{n-2}$, is approximately equal to $T/2$. Accordingly, the improved multi-phase clock generator with novel interpolation circuits advantageously reduces and/or eliminates skew between different clock phase signals attributed to duty cycle distortion of the input clock cycles. The improved clock circuit 500 advantageously generates a plurality of clock phases from a single-ended clock signal in which the clock phases have reduced skew compared to conventional clock circuits.

Although the circuits and methods have been described in terms of exemplary embodiments, they are not limited thereto. Rather, the appended claims should be construed broadly, to include other variants and embodiments of the circuits and methods, which may be made by those skilled in the art without departing from the scope and range of equivalents of the circuits and methods.

What is claimed is:

1. A conversion circuit, comprising:
   a first inverter having an input node configured to receive a single-ended signal;
   second and third inverters each having respective inputs coupled to an output of the first inverter;
   a fourth inverter having an input coupled to an output of the second inverter and having an output coupled to a first node;
   a fifth inverter having an input coupled to the first node and an output coupled to a second node to which an output of the third inverter is coupled; and
   sixth and seventh inverters configured to respectively output a differential signal based on the single-ended signal, the sixth inverter having an input coupled to the first node, and the seventh inverter having an input coupled to the second node.

2. The conversion circuit of claim 1, wherein each of the transistors are formed using complementary metal oxide semiconductors.

3. The conversion circuit of claim 1, further comprising a latch coupled to the outputs of the sixth and seventh inverters for reducing a skew of the differential signals.

4. The conversion circuit of claim 3, wherein the latch includes a pair of cross-coupled inverters.

5. The conversion circuit of claim 1, wherein each inverter includes:
   a first transistor of a first type having a source coupled to a first voltage supply line, a drain coupled to an output node, and a gate coupled to an input node; and
   a second transistor of a second type having a source coupled to a second voltage supply line, a drain coupled to the output node, and a gate coupled to the input node.

6. A method, comprising:
   receiving a single-ended clock signal at an input of a first inverter;
   receiving first and second inverted clock signals at a respective input of second and third inverters;

delaying the first inverted clock signal relative to the second inverted clock signal;

generating a third clock signal from the first inverted clock signal that is delayed relative to the second inverted clock signal;

combining the first inverted clock signal that is delayed relative to the second clock signal with the second clock signal to provide a fourth clock signal; and outputting the third and fourth clock signals from respective inverters.

7. The method of claim 6, further comprising:

further delaying the first inverted clock signal prior to combining the first inverted clock signal with the second clock signal.

8. The method of claim 7, wherein the first inverted clock signal is delayed relative to the second clock signal by passing through a second inverter.

9. The method of claim 8, wherein the first inverted clock signal is further delayed relative to the second clock signal by passing through a third inverter.

10. The method of claim 6, further comprising:

receiving the third and fourth clock signals from the respective inverters at a latch;

reducing a skew between the third and fourth clock signals at the latch; and outputting the third and fourth clock signals from the latch.

11. The method of claim 10, wherein the latch includes a pair of cross-coupled inverters.

12. A circuit, comprising:

a first inverter having an input node configured to receive a single-ended signal;

second and third inverters each having respective inputs coupled to an output of the first inverter;

a fourth inverter having an input coupled to an output of the second inverter and having an output coupled to a first node;

a fifth inverter having an input coupled to the first node and an output coupled to a second node to which an output of the third inverter is coupled;

a sixth inverter having an input having an input coupled to the first node;

a seventh inverter having an input coupled to the second node; and a latch coupled to respective outputs of the sixth and seventh inverters, the latch configured to reduce a relative skew between differential signals received from the sixth and seventh inverters.

13. The circuit of claim 12, wherein the latch includes a pair of cross-coupled inverters.

14. The circuit of claim 13, wherein each inverter includes:

a first transistor of a first type having a source coupled to a first voltage supply line, a drain coupled to an output node, and a gate coupled to an input node; and a second transistor of a second type having a source coupled to a second voltage supply line, a drain coupled to the output node, and a gate coupled to the input node.

15. The circuit of claim 12, wherein each of the inverters are formed using complementary metal oxide semiconductors.

\* \* \* \* \*